United States Patent
Guyette et al.

(10) Patent No.: US 11,973,489 B2
(45) Date of Patent: Apr. 30, 2024

(54) TRANSVERSELY-EXCITED FILM BULK ACOUSTIC RESONATOR MATRIX FILTERS WITH SPLIT DIE SUB-FILTERS

(71) Applicant: Murata Manufacturing Co., Ltd., Nagaokakyo (JP)

(72) Inventors: Andrew Guyette, San Mateo, CA (US); Neal Fenzi, Santa Barbara, CA (US); Greg Dyer, Santa Barbara, CA (US); Sean McHugh, Santa Barbara, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/940,909

(22) Filed: Sep. 8, 2022

(65) Prior Publication Data

US 2023/0006646 A1    Jan. 5, 2023

Related U.S. Application Data

(63) Continuation of application No. 17/362,727, filed on Jun. 29, 2021, which is a continuation-in-part of
(Continued)

(51) Int. Cl.
*H03H 9/205* (2006.01)
*H03H 3/02* (2006.01)
(Continued)

(52) U.S. Cl.
CPC .............. *H03H 9/205* (2013.01); *H03H 3/02* (2013.01); *H03H 9/02031* (2013.01);
(Continued)

(58) Field of Classification Search
CPC .......... H03H 9/205; H03H 9/54; H03H 9/542; H03H 9/706; H03H 9/02228; H03H 9/564; H03H 9/568; H04B 1/0057
See application file for complete search history.

(56) References Cited

U.S. PATENT DOCUMENTS 5,204,575 A   4/1993   Kanda et al.
5,274,345 A   12/1993  Gau
(Continued)

FOREIGN PATENT DOCUMENTS

CN   209608623 U   11/2019
WO   2016017104    2/2016
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Andrea Lindgren Baltzell
*Assistant Examiner* — Kimberly E Glenn
(74) *Attorney, Agent, or Firm* — ARENTFOX SCHIFF LLP

(57) ABSTRACT

A radio frequency filter includes at least a first sub-filter and a second sub-filter connected in parallel between a first port and a second port. Each of the sub-filters has a piezoelectric plate having front and back surfaces, the back surface attached to a substrate, and portions of the piezoelectric plate forming diaphragms spanning respective cavities in the substrate. A conductor pattern is formed on the front surface of the plate, the conductor pattern includes interdigital transducers (IDTs) of a respective plurality of resonators, with interleaved fingers of each IDT disposed on a respective diaphragm of the plurality of diaphragms. A thickness of the portions of the piezoelectric plate of the first sub-filter is different from a thickness of the portions of the piezoelectric plate of the second sub-filter.

20 Claims, 8 Drawing Sheets

Related U.S. Application Data application No. 17/133,849, filed on Dec. 24, 2020, now Pat. No. 11,405,019, said application No. 17/133,849 is a continuation-in-part of application No. 17/121,724, filed on Dec. 14, 2020.

(60) Provisional application No. 63/127,095, filed on Dec. 17, 2020, provisional application No. 63/087,789, filed on Oct. 5, 2020.

(51) Int. Cl.
*H03H 9/02* (2006.01)
*H03H 9/13* (2006.01)
*H03H 9/17* (2006.01)
*H03H 9/54* (2006.01)
*H03H 9/56* (2006.01)

(52) U.S. Cl.
CPC .... *H03H 9/02157* (2013.01); *H03H 9/02228* (2013.01); *H03H 9/13* (2013.01); *H03H 9/17* (2013.01); *H03H 9/545* (2013.01); *H03H 9/568* (2013.01)

(56) References Cited

U.S. PATENT DOCUMENTS

| | | |
|---|---|---|
| 5,281,934 A | 1/1994 | Shiau et al. |
| 5,446,330 A | 8/1995 | Eda et al. |
| 5,552,655 A | 9/1996 | Stokes et al. |
| 5,726,610 A | 3/1998 | Allen et al. |
| 5,729,186 A | 3/1998 | Seki et al. |
| 5,853,601 A | 12/1998 | Krishaswamy |
| 5,952,899 A | 9/1999 | Kadota et al. |
| 6,172,582 B1 | 1/2001 | Hickernell |
| 6,271,617 B1 | 8/2001 | Yoneda et al. |
| 6,377,140 B1 | 4/2002 | Ehara et al. |
| 6,452,909 B1 | 9/2002 | Bauer |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,724,278 B1 | 4/2004 | Smith |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,476,469 B2 | 11/2019 | Gong et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,206,009 B2 | 12/2021 | Plesski |
| 11,228,296 B2 | 1/2022 | Dyer |
| 11,239,816 B1 | 2/2022 | McHugh |
| 11,239,822 B2 | 2/2022 | Garcia |
| 11,264,966 B2 | 3/2022 | Yantchev |
| 11,264,969 B1 | 3/2022 | Fenzi |
| 11,271,539 B1 | 3/2022 | Yantchev |
| 11,271,540 B1 | 3/2022 | Yantchev |
| 11,283,424 B2 | 3/2022 | Turner |
| 11,309,865 B1 | 4/2022 | Guyette |
| 11,323,089 B2 | 5/2022 | Turner |
| 11,323,090 B2 | 5/2022 | Garcia |
| 11,323,091 B2 | 5/2022 | Kay |
| 11,323,095 B2 | 5/2022 | Garcia |
| 11,323,096 B2 | 5/2022 | Yantchev |
| 11,349,450 B2 | 5/2022 | Yantchev |
| 11,349,452 B2 | 5/2022 | Yantchev |
| 11,356,077 B2 | 6/2022 | Garcia |
| 11,368,139 B2 | 6/2022 | Garcia |
| 11,374,549 B2 | 6/2022 | Yantchev |
| 11,381,221 B2 | 7/2022 | McHugh |
| 11,405,017 B2 | 8/2022 | Guyette et al. |
| 11,476,834 B2 | 10/2022 | Guyette et al. |
| 2002/0079986 A1 | 6/2002 | Ruby et al. |
| 2002/0130736 A1 | 9/2002 | Mukai |
| 2002/0153970 A1 | 10/2002 | Noto |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0130410 A1 | 7/2004 | Nishimura et al. |
| 2004/0140866 A1 | 7/2004 | Taniguchi |
| 2004/0233020 A1 | 11/2004 | Nakamura |

(56) References Cited

U.S. PATENT DOCUMENTS

| | | |
|---|---|---|
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0055485 A1 | 3/2006 | Lobeek |
| 2006/0152107 A1 | 7/2006 | Tanaka |
| 2006/0179642 A1 | 8/2006 | Kawamura |
| 2007/0030096 A1 | 2/2007 | Nichihara et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2008/0309430 A1 | 12/2008 | Tsuzuki et al. |
| 2010/0019866 A1 | 1/2010 | Hara et al. |
| 2010/0064492 A1 | 3/2010 | Tanaka |
| 2010/0117483 A1 | 5/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182008 A1* | 6/2016 | Bhattacharjee .......... H03H 9/25 29/25.35 |
| 2016/0182009 A1 | 6/2016 | Bhattacharjee |
| 2017/0063332 A1 | 3/2017 | Gilbert et al. |
| 2017/0070405 A1 | 3/2017 | Hashemi et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0245518 A1 | 8/2019 | Ito |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0028481 A1 | 1/2020 | Sun et al. |
| 2020/0036357 A1 | 1/2020 | Mimura |
| 2020/0083861 A1 | 3/2020 | Matsuo |
| 2020/0083863 A1 | 3/2020 | Makkonen et al. |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0350891 A1 | 11/2020 | Turner |
| 2021/0013859 A1 | 1/2021 | Turner et al. |
| 2021/0119595 A1 | 4/2021 | Turner et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |
| 2021/0399750 A1 | 12/2021 | Varela Campelo |

FOREIGN PATENT DOCUMENTS

| | | |
|---|---|---|
| WO | 2018003273 | 1/2018 |
| WO | 2018079522 A1 | 5/2018 |
| WO | 2019241174 A1 | 12/2019 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

(56) References Cited

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).
Material Properties of Tibtech Innovations, © 2018 TIBTECH Innovations (Year 2018). 2018.
Merriam Webster, dictionary meaning of the word "diaphragm", since 1828, Merriam Webster (Year: 1828) 1828.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Moussa et al. Review on Triggered Liposomal Drug Delivery with a Focus on Ultrasound 2015, Bentham Science Publishers, pp. 16 (Year 2005) 2005.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Naumenko et al., "Optimal orientations of Lithium Niobate for resonator SAW filters", 2003 IEEE Ultrasonics Symposium—pp. 2110-2113. (Year: 2003).
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
Reinhardt, "Acoustic filters based on thin single crystal LiNbQ,3 films: status and prospects", 2014 IEEE International Ultrasonics Symposium Proceedings, pp. 773-781 (Year: 2014).
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G. , Surface acoustic wave devices on silicon using patterned and thin film ZnO, Ph.D. thesis, Feb. 2016, Indian Institute of technology Guwahati, Assam, India Feb. 2016.
Sinha et al., "Slanted finger Inter-digital Transducers for the design of improved performance small shape factor mid-bandwidth SAW filters", IEEE MTT-S International Microwave and RF Conference, 2013. (Year: 2013).
Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) 00 Jan. 2015.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Wu et al., "Frequency band-gap measurement of two-dimensional air/silicon phononic crystals using layered slanted finger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) 00 Jan. 2015.

* cited by examiner

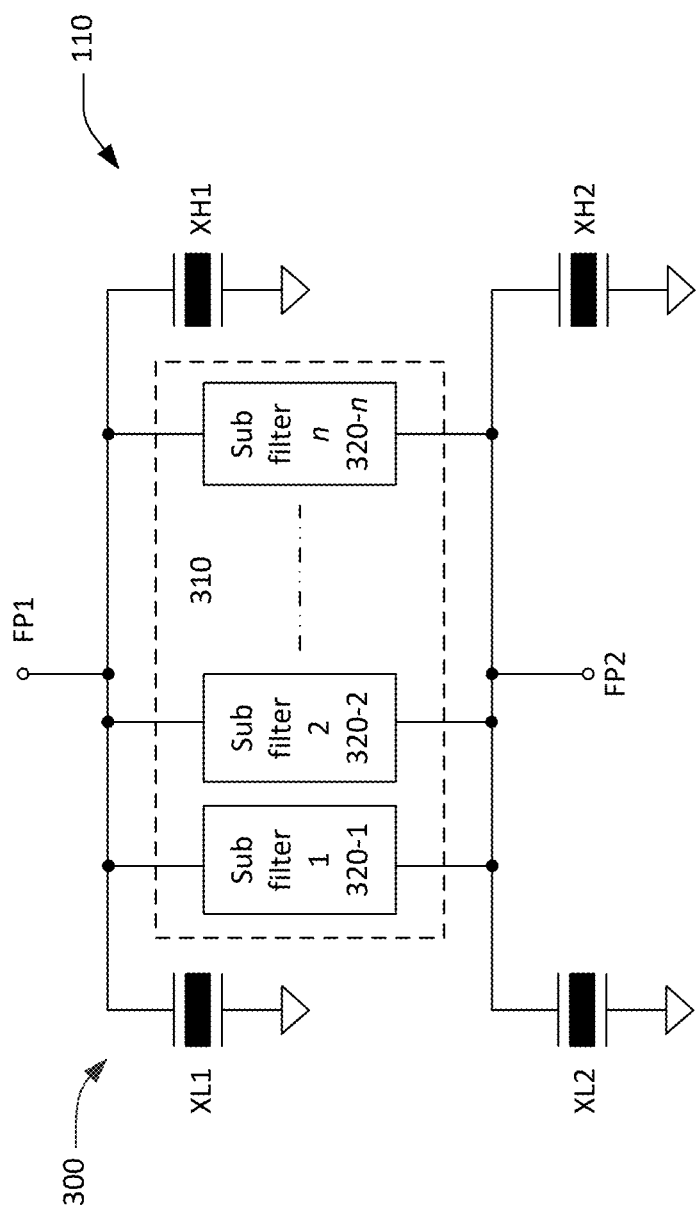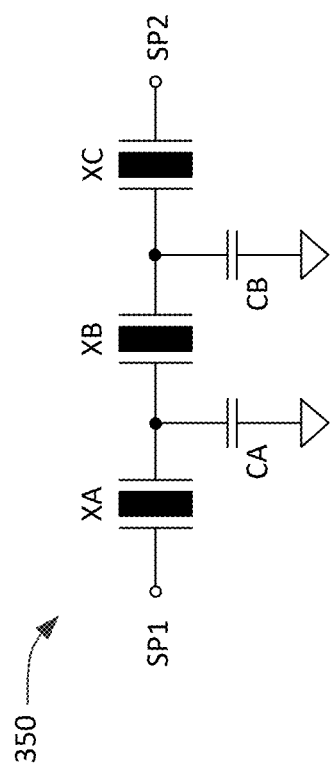
FIG. 3A
FIG. 3B

TRANSVERSELY-EXCITED FILM BULK ACOUSTIC RESONATOR MATRIX FILTERS WITH SPLIT DIE SUB-FILTERS

RELATED APPLICATION INFORMATION

This patent is a continuation of co-pending U.S. application Ser. No. 17/362,727, filed Jun. 29, 2021, entitled TRANSVERSELY-EXCITED FILM BULK ACOUSTIC RESONATOR MATRIX FILTERS WITH SPLIT DIE SUB-FILTERS which claims priority from provisional patent application 63/127,095, filed Dec. 17, 2020, entitled SPLIT SUB-FILTER MATRIX XBAR FILTER, both which are incorporated herein by reference.

U.S. application Ser. No. 17/362,727 is also a continuation-in-part of application Ser. No. 17/133,849, filed Dec. 24, 2020, titled TRANSVERSELY-EXCITED FILM BULK ACOUSTIC RESONATOR MATRIX FILTERS, which is a continuation-in-part of application Ser. No. 17/121,724, filed Dec. 14, 2020, titled ACOUSTIC MATRIX FILTERS AND RADIOS USING ACOUSTIC MATRIX FILTERS, which claims priority from provisional patent application 63/087,789, filed Oct. 5, 2020, entitled MATRIX XBAR FILTER. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR, which is incorporated herein by reference. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability.

XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 3A is a schematic diagram of a matrix filter using acoustic resonators.

FIG. 3B is a schematic diagram of a sub-filter of FIG. 3A.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in acoustic filters for filtering microwave signals. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

Acoustic filters are typically required to match a system impedance, such as 50 ohms. The system impedance and operating frequency dictate a required equivalent capacitance $C_0$ for a filter using a conventional ladder circuit. C0 is inversely proportional to frequency. XBAR resonators have low capacitance per unit area compared to other acoustic resonators. Thus, ladder filter circuits using XBAR resonators may be much larger than comparable filters using other types of acoustic resonators.

The following describes a filter circuit architecture that allows low frequency filters to be implemented with small XBAR resonators. It also describes improved XBAR resonators, filters and fabrication techniques that reduce static capacitance in radio frequency filters having sub-filters connected in parallel between two ports where the sub-filters have XBARs on different substrates of different die. The sub-filter XBARs have a piezoelectric plate with a back surface attached to the different substrates and portions of the plate forming diaphragms spanning cavities in the substrates. Interleaved fingers of IDTs are on the diaphragms and the thicknesses of the piezoelectric plate portions may be different.

Figure 1:
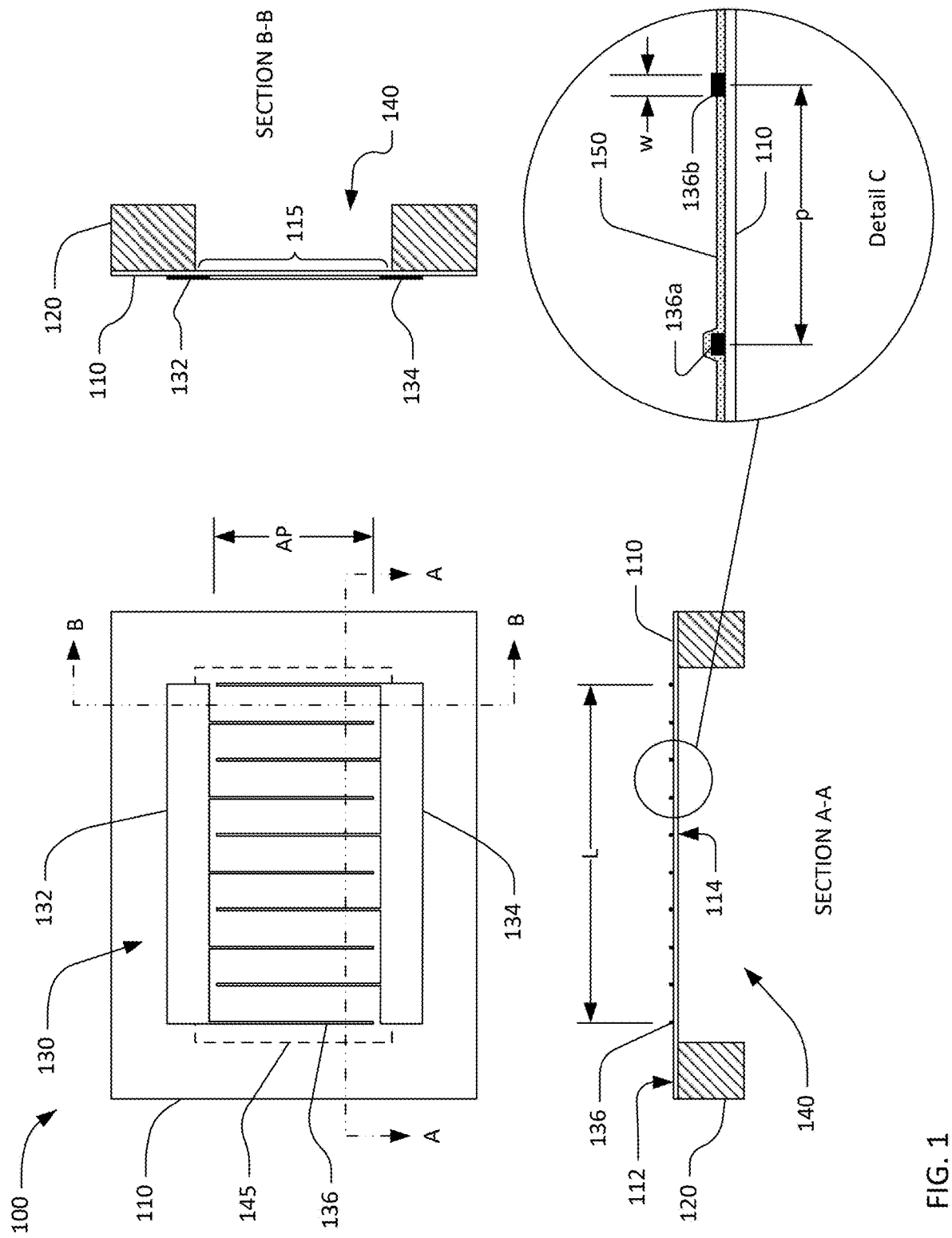
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
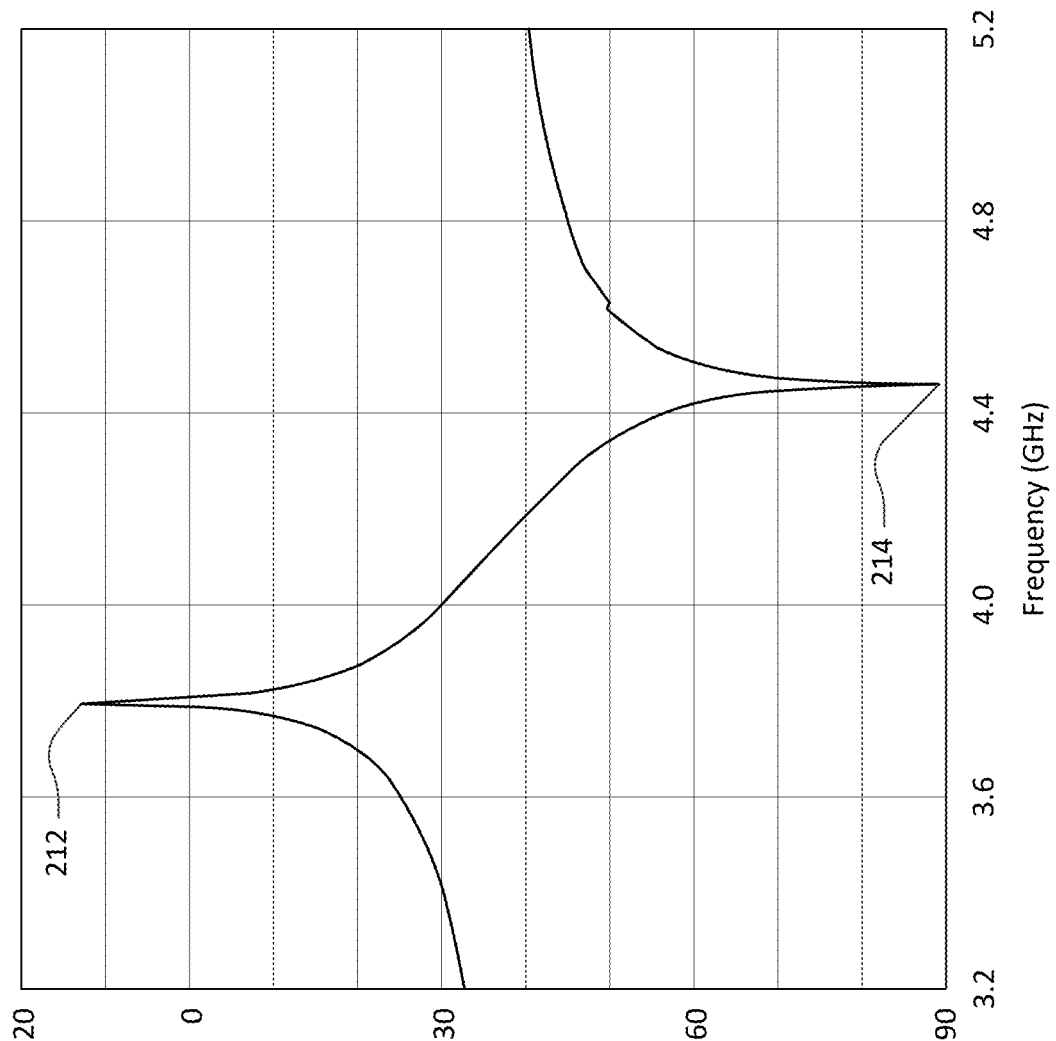
FIG. 2B is a graph of the admittance of an ideal acoustic resonator.
Figure 2A:
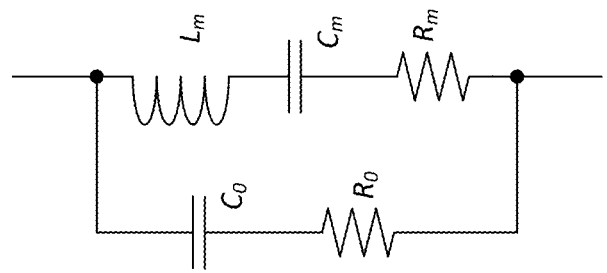
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma=C_0/C_m$ is dependent on the resonator structure and the type and the orientation of the crystalline axes of the piezoelectric material.

FIG. 2B is a graph 200 of the magnitude of admittance of a theoretical lossless acoustic resonator. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 2C:
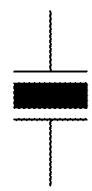
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures.

FIG. 3A is a schematic diagram of a matrix filter 300 using acoustic resonators. The matrix filter 300 includes an array 310 of n sub-filters 320-1, 320-2, 320-n connected in parallel between a first filter port (FP1) and a second filter port (FP2), where n is an integer greater than one. Each of the n sub-filters 320-1, 320-2, 320-n is a bandpass filter having a bandwidth about 1/n times the bandwidth of the matrix filter 300. The sub-filters 320-1, 320-2, 320-n have contiguous passbands such that the bandwidth of the matrix filter 300 is equal to the sum of the bandwidths of the constituent sub-filters. In the subsequent examples in this patent n=3. n can be less than or greater than 3 as necessary to provide the desired bandwidth for the matrix filter 300. In some cases, the n sub-filters 320-1, 320-2, 320-n may include one or more XBARs. The filter 300 and/or sub-filters may be RF filters that pass frequency bands defined by the 5G NR standard.

The array 310 of sub-filters is terminated at the FP1 end by acoustic resonators XL1 and XH1, which are preferably but not necessarily XBARs. The array 310 of sub-filters is terminated at the FP2 end by acoustic resonators XL2 and XH2, which are preferably but not necessarily XBARs. The acoustic resonators XL1, XL2, XH1, and XH2 create "transmission zeros" at their respective resonance frequencies. A "transmission zero" is a frequency where the input-output transfer function of the filter 300 is very low (and would be zero if the acoustic resonators XL1, XL2, XH1, and XH2 were lossless). The zero transmission may be caused by one or more of the acoustic resonators creating a very low impedance to ground and thus, in this configuration cause the sub-filters to be removed as filtering components as the acoustic resonators are basically short circuits to ground so that the sub-filters have no effect on the filter 300 during transmission zero frequencies. Typically, but not necessarily, the resonance frequencies of XL1 and XL2 are equal, and the resonance frequencies of XH1 and XH2 are equal. The resonant frequencies of the acoustic resonators XL1, XL2 are selected to provide transmission zeros adjacent to the lower edge of the filter passband. XL1 and XL2 may be referred to as "low-edge resonators" since their resonant frequencies are proximate the lower edge of the filter passband. The acoustic resonators XL1 and XL2 also act as shunt inductances to help match the impedance at the ports of the filter to a desired impedance value. In the subsequent examples in this patent, the impedance at all ports of the filters is matched to 50 ohms. The impedance may be another value if desired, such as 20, 100 or 1000 ohms. The resonant frequencies of acoustic resonators XH1, XH2 are selected to provide transmission zeros at or above the higher edge of the filter passband. XH1 and XH2 may be referred to as "high-edge resonators" since their resonant frequencies are proximate the higher edge of the filter passband. High-edge resonators XH1 and XH2 may not be required in all matrix filters, such as filters where high rejection above the passband is not required.

FIG. 3B is a schematic diagram of a sub-filter 350 suitable for each of sub-filters 320-1, 320-2, and 320-n of filter 300. The sub-filter 350 includes three acoustic resonators XA, XB, XC connected in series between a first sub-filter port (SP1) which can be connected to FP1 and a second sub-filter port (SP2) which can be connected to FP2. The acoustic resonators XA, XB, XC are preferably but not necessarily XBARs. The sub-filter 350 includes two coupling capacitors CA, CB, each of which is connected between ground and a respective node between two of the acoustic resonators. The inclusion of three acoustic resonators in the sub-filter 350 is exemplary. A sub-filter may have m acoustic resonators, where m is an integer greater than one. A sub-filter with m acoustic resonators includes m−1 coupling capacitors The m acoustic resonators of a sub-filter are connected in series between the two ports SP1 and SP2 of a sub-filter and each of the m−1 coupling capacitors is connected between ground and a node between a respective pair of acoustic resonators from the in acoustic resonators.

Compared to other types of acoustic resonators, XBARs have very high electromechanical coupling (which results in a large difference between the resonance and anti-resonance frequencies), but low capacitance per unit area. The matrix filter architecture, as shown in FIG. 3A and FIG. 3B, takes advantage of the high electromechanical coupling of XBARs without requiring high resonator capacitance. Thus, this architecture improves high frequency bandpass filtering by passing a wider range of high frequency without requiring processing to form or the space to form high-edge resonators XH1 and XH2.

Figure 4:
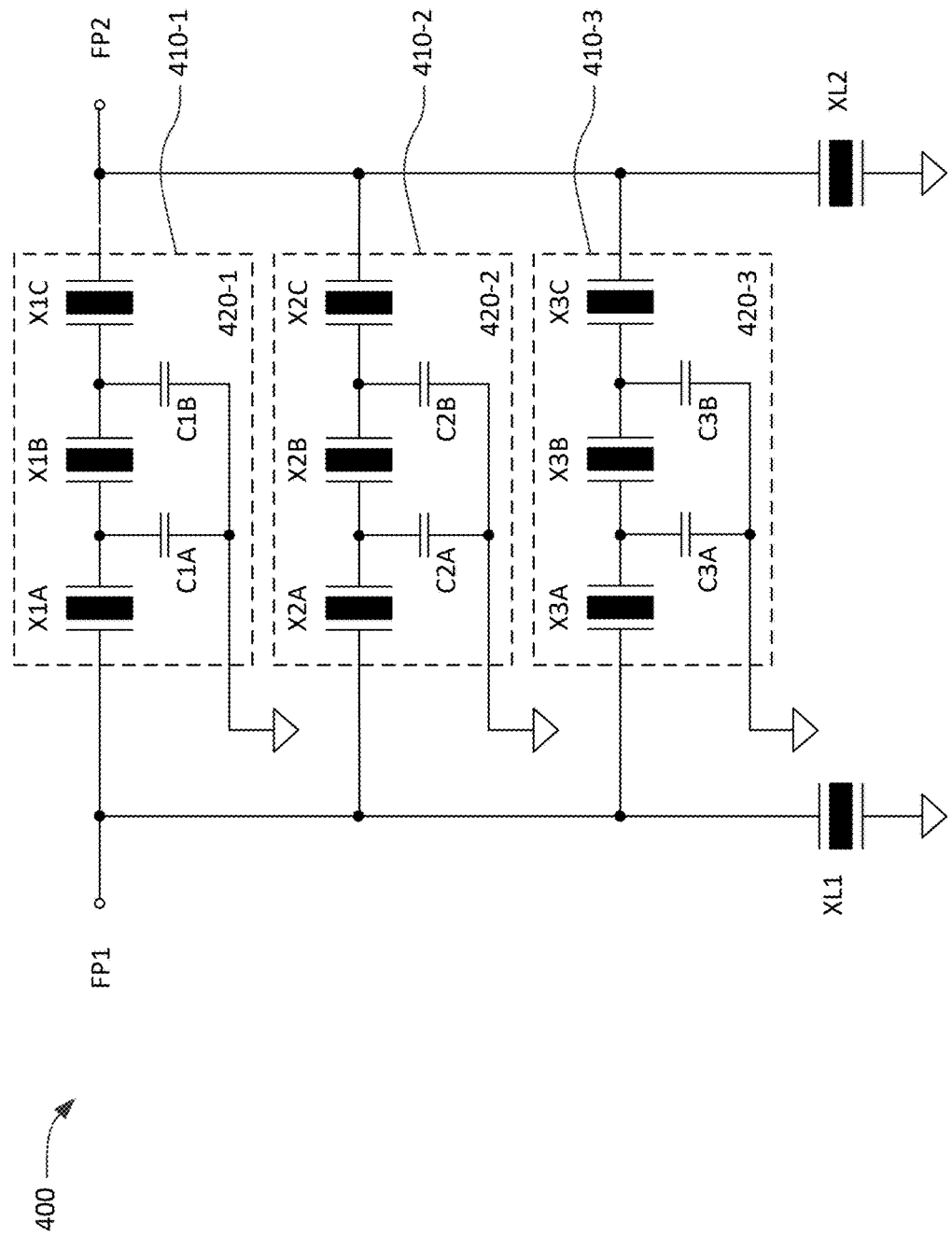
FIG. 4 is a schematic diagram of a matrix filter using transversely-excited film bulk acoustic resonators.

FIG. 4 is a schematic circuit diagram of an exemplary matrix filter 400 implemented with XBARs. The matrix filter 400 includes three sub-filters 420-1, 420-2, 420-3 connected in parallel between a first filter port (FP1) and a second filter port (FP2). The sub-filters 420-1, 420-2, 420-3 have contiguous passbands such that the bandwidth of the matrix filter 300 is equal to the sum of the bandwidths of the constituent sub-filters. Each sub-filter includes three XBARs connected in series and two coupling capacitors. For example, sub-filter 420-1 includes series XBARs X1A, X1B, and X1C and two coupling capacitors C1A, C1B each of which is connected between ground and a respective node between two of the acoustic resonators. Components of the other sub-filters 420-2 and 420-3 are similarly identified using 2's and 3's as those using 1's in sub-filter 420-1. Low-edge XBARs XL1 and XL2 are connected between FP1 and FP2, respectively, and ground. All of the capacitors within the sub-filters are connected to ground through a common inductor L1. The inclusion of the inductor L1 improves the out-of-band rejection of the matrix filter 400 which improves filtering. The matrix filter 400 does not include high-edge resonators.

The exemplary matrix filter 400 is symmetrical in that the impedances at FP1 and FP2 are both equal to 50 ohms. The impedance may be another value if desired, such as 20, 100 or 1000 ohms. The internal circuitry of the filter is also symmetrical, with XBARs X_A and X_C within each sub-filter being the same and low-edge resonators XL1 and XL2 being the same. Other matrix filters may be designed to have significantly different impedances at FP1 and FP2, in which event the internal circuitry will not be symmetrical.

Figure 5:
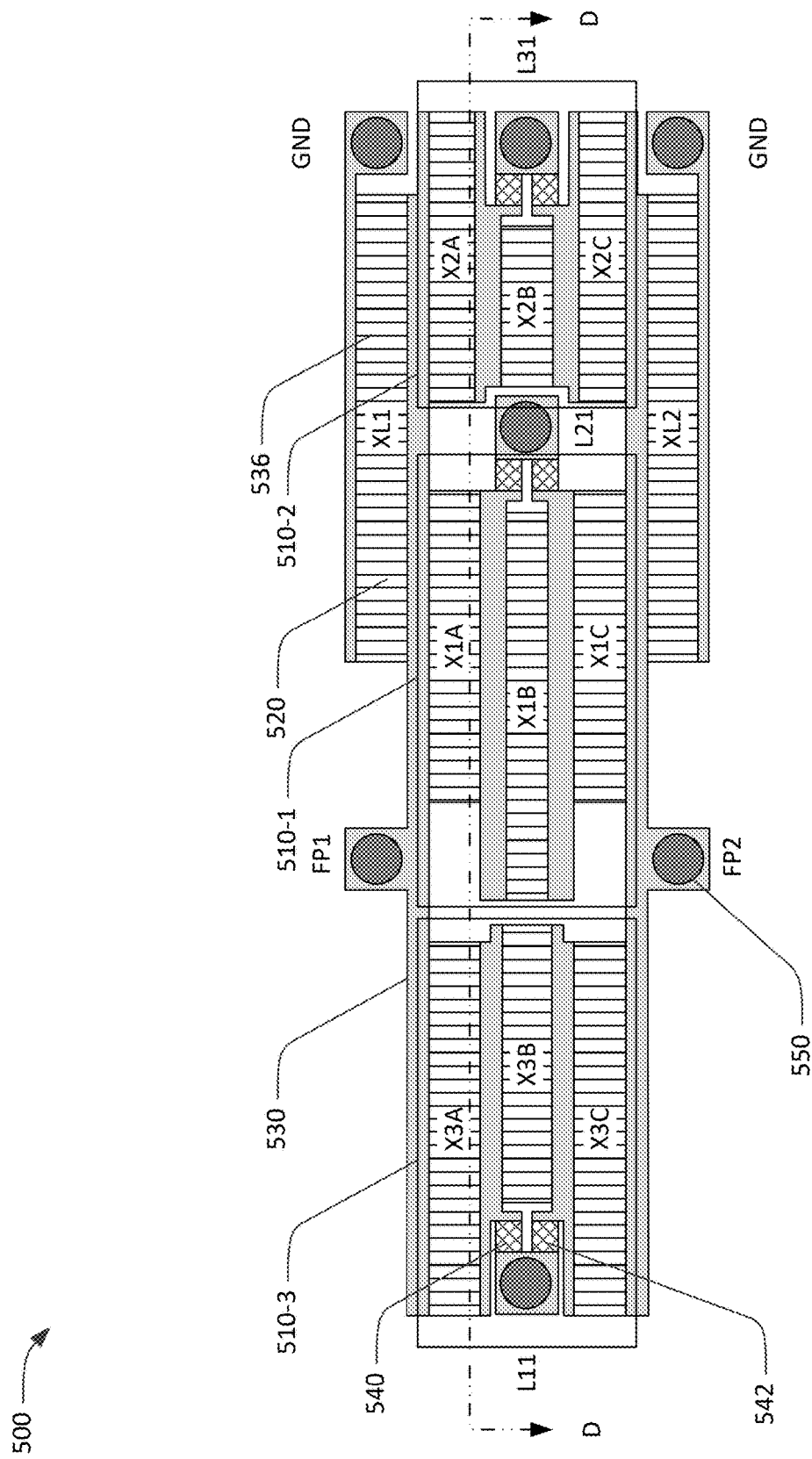
FIG. 5 is plain view of an embodiment of the matrix filter of FIG. 4.

FIG. 5 is a plan view of an exemplary matrix filter 500 which has the same schematic circuit diagram as the matrix filter 400 of FIG. 4. The exemplary matrix filter is an LTE band 41 bandpass filter with a passband from 2496 to 2690 MHz.

The matrix filter 500 includes three Z-cut lithium tantalate piezoelectric plate thickness portions 510-3 for filter 410-3, 510-1 for filter 410-1, and 510-2 for filter 410-2. The portions 510-1, 2 and 3 may be three different piezoelectric diaphragm thicknesses. Any number of portions 510-1, 2 and 3 can be on any number of plates; and any number of those plates can be on any number of substrates of different die or chips. Other matrix filters may use lithium niobate piezoelectric plates and other crystal orientations including rotated Z-cut and rotated Y-cut.

For example, the portions 510-1, 2 and 3 could be three separate plates each having a different thickness, or three portions of the same plate having different thicknesses created using a process multiple thicknesses on the same plate. Such a process may thin portions 510-2 and 3 from the thickness of portion 510-1; and then further thin portion 510-3 from the thickness of portion 510-2.

The back surface of each plate is attached to one substrate. In another case it is attached to more than one substrate. The back surface of each of portions 510-1, 2 and 3 is bonded to a substrate. Whether or not they are of the same or of separate plates, in a first case, the portions 510-1, 2 and 3 are each bonded to a separate substrate of a different die (substrates and die not visible in FIG. 5). In a second case, two of portions 510-1, 2 and 3 are bonded to one substrate of one die; and the other portion is bonded to a second substrate of a separate die. In a third case, all three portions 510-1, 2 and 3 are bonded to a single plate which is bonded to a single substrate of a single die.

The thickness of the piezoelectric plate portion 510-3 between its front and back surfaces is the thinnest of all three portions 510-1, 2 and 3. The thickness of portion 510-1 is the thickest and that of portion 510-2 is in between that of the thickness of other two portions. The thickness of plate portion 510-3 is 730 nm. The thickness of plate portion 510-2 is 744 nm. The thickness of plate portion 510-1 is 762 nm. Each of these three thicknesses may be plus or minus 10 nm.

The low-edge resonators XL1 and XL2 may be formed using or on the thickest plate portion, such as portion 510-1. Any high-edge resonator will be formed using or on the thinnest plate portion, such as portion 510-3.

The matrix filter 500 includes eleven XBARs, such as the XBAR 520. A cavity (not visible) is formed in the substrates under each XBAR. Each XBAR is shown as a rectangle with vertical hatching and is identified by the designator (XL1, X1A, . . . ) used in the schematic diagram of FIG. 4. The vertical hatching is representative of the direction of the IDT fingers of each XBAR but not to scale. Each XBAR has between 65 and 130 IDT fingers, one of which is shown as finger 536. The IDT fingers are aluminum and 925 nm thick. The apertures AP (vertical direction as shown in FIG. 5) of the overlap of the interleaved fingers of the XBARs range from 40 microns to 58 microns, and the lengths L (left-right direction as shown in FIG. 5) range from 500 to 1000 microns. In other embodiments of XBAR matrix filters, the XBARs may be divided into sections to limit the length of the diaphragm within each XBAR. The pitch p of the IDTs of each XBAR is between 7.5 and 8.6 microns and the mark/pitch ratio of each XBAR is between 0.22 and 0.31.

The XBARs are connected to each other by conductors such as conductor 530 that may also be formed on and connect between the substrates. Cross-hatched rectangles are metal-insulator-metal capacitors used as the sub-filter coupling capacitors in this example of FIG. 4, of which only capacitors 540 and 542 are identified. The identified capacitors 540 and 542 are C3A and C3B, respectively, in the schematic diagram of FIG. 4. The other sub-filter coupling capacitors C1A-B and C2A-B for filters 410-1 and 410-2, respectively, are connected similarly to capacitors 540 and 542. The sub-filter coupling capacitors C1A-B, C2A-B and C3A-B are shown formed on and/or from the same plate portion 510-1, 2 or 3 of the corresponding filter 410-1, 2 or 3, respectively, such as shown in the figure. However, the coupling capacitors may be formed on any of the plate portions 510-1, 2 or 3; or on separate portions of any of the substrates. The capacitors C1A-B, C2A-B and C3A-B may be formed on the substrates 420-1, 2 or 3, respectively. The coupling capacitors may be separate from the substrates of portions 510, such as by being discrete components or formed on a circuit card used to interconnect the resonators.

Connections from the filter 510 and circuitry external to the filter are made by means of conductive pads indicated by shaded circles, such as conductive pad 550. The conductive pads for Filter Port 1 (FP1), Filter Port 2 (FP2), and ground (GND) are labeled. The three other conductive pads L11, L21 and L31 are connect to ground through inductor L1 (in FIG. 4), which is located external to the filter 510. The conductor pads may be connected using solder bumps or other connections to the pads. The conductor pads may be formed on and/or be connect between the substrates.

As previously described, the sub-filters of a matrix filter have contiguous passbands that span the passband of the matrix filter. Within a matrix filter, the center frequency of the passband of each sub-filter is different from the center frequency of any other sub-filter. Consequentially, the resonance frequencies of the XBARs in one sub-filter are different from the resonance frequencies of the XBARs within any other sub-filter.

The resonance frequency of an XBAR is primarily determined by the thickness of the diaphragm or piezoelectric plate portion of the diaphragm within the XBAR. The resonance frequency has a smaller dependence on IDT pitch and mark or finger width. U.S. Pat. No. 10,491,291 describes the use of a dielectric layer formed between the IDT fingers to adjust the resonance frequency of an XBAR. U.S. Pat. No. 10,998,877 describes the use of the plate diaphragm portion thicknesses to adjust the resonance frequency of an XBAR.

Figure 6:
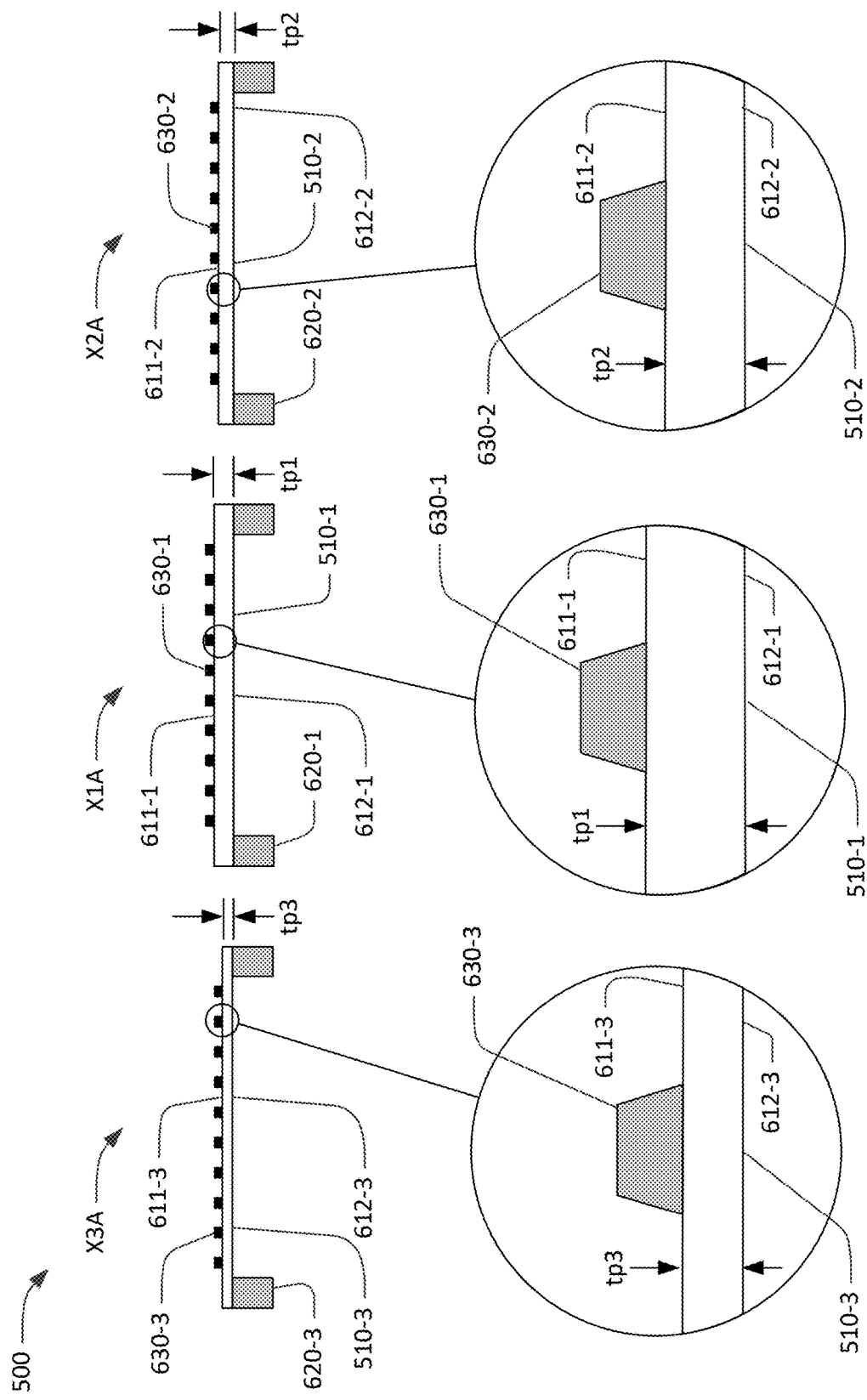
FIG. 6 is a schematic cross-sectional view of the matrix filter of FIG. 5.

FIG. 6 is a schematic cross-section view of the matrix filter 500 at a section plane D-D defined in FIG. 5. The section plane D-D passes through one XBAR (X3A, X1A, X2A) from each of the three sub-filters in the matrix filter 500. Each XBAR includes interleaved IDT fingers (of which only IDT finger 630-1, 2 or 3 is identified) formed on a respective diaphragm spanning a respective cavity in a substrate 620-1, 2 or 3 or a die (not visible). Substrates 620-1, 2 and 3 may be one same, two different or three different substrates. Each substrate 620-1, 2 or 3 may have other components of filter 500. Each diaphragm includes a different piezoelectric plate portion 510-1, 2 or 3 having a different thickness between its front and back surfaces. Each of the front and back surfaces may be planar or flat across the entire surface of the plate or plate portion 510-1, 2 or 3. The back surface of each plate portion may be attached to one or more substrates of one or more die. As in previous figures, the thickness of the piezoelectric plate portions 510-1, 2 or 3 and the thickness, pitch, and finger width of the IDTs are greatly exaggerated for visibility. Drawn to scale, the thickness of the piezoelectric plate portions 10-1, 2 or 3 and the IDT fingers could be less than one-half percent of the thickness of the substrate 620-1, 2 or 3 and each IDT would have 65 to 130 IDT fingers.

The three detail views illustrate the use of piezoelectric plate portion thickness to set the resonance frequencies of the XBARs within each sub-filter. Consider first the detail view of an IDT finger of XBAR X1A (the middle view of the three detail views), which shows an IDT finger 630-1 formed on a portion of the piezoelectric plate portion 510-1. The IDT finger 630-1 is shown with a trapezoidal cross-section. The trapezoidal shape is exemplary and IDT fingers may have other cross-sectional shapes. The piezoelectric plate portion 510-1 has thickness tp1 extending between its front surface 611-1 and its back surface 612-1. Similarly, the right-hand detail shows piezoelectric plate portion 510-2 having thickness tp2 extending between its front surface 611-2 and its back surface 612-2. The left-hand detail shows piezoelectric plate portion 510-3 having thickness tp3 extending between its front surface 611-3 and its back surface 612-3. Each of thicknesses tp1, tp2 and tp3 is different than any of the others.

In this example, XBAR X1A is an element of the sub-filter with the lowest passband frequency and XBAR X3A is an element of the sub-filter with the highest passband frequency. In this case tp1>tp2>tp3≥0. In other cases, two of the thickness tp1, tp2 and tp3 are the same but the third thickness is greater than or less than those two thicknesses. In some cases, there may be only two tp thicknesses, and in other cases there may be more than three tp thicknesses.

Further in this example, XBARs X1B and X1C are also formed on portion 510-1 with XBAR X1A as elements of the sub-filter 410-1 with the lowest passband frequency. XBARs X3B and X3C are also formed on portion 510-3 with XBAR X3A as elements of the sub-filter 410-3 with the highest passband frequency. Finally, XBAR X2B and X2C are also formed on portion 510-2 with XBAR X2A as elements of the sub-filter 410-2 with the passband frequency between that of filters 410-1 and 410-3.

In a more general case where a matrix filter has n sub-filters, which are numbered in order of increasing passband frequency, tp1>tp2> . . . >tpn, where tpi is the thickness of the piezoelectric plate portion extending between its front and a back surfaces of sub-filter i.

The low-edge resonators XL1 and XL2 may be formed using the thickest of the plate portions 510-1, 2 or 3. The low-edge resonators XL1 and XL2 may have their resonance frequencies set by the thickness of the plate portion they are formed using. In addition, or independently, the low-edge resonators XL1 and XL2 may have their resonance frequencies set by a thickness of a top layer dielectric. In this case, the space between IDT fingers of XL1 and XL2 and adjacent IDT fingers (and optionally the IDT finger) would be covered by a dielectric layer having a thickness td1 and td2 to set the XL1 and XL2 resonance frequencies. The dielectric layers may be silicon dioxide, silicon nitride, aluminum oxide or some other dielectric material or combination of materials. The dielectric layers may be the same or different materials.

An XBAR filter device typically includes a passivation dielectric layer applied over the entire surface of the device, other than contact pads, to seal and passivate the conductor patterns and other elements of the device.

Figure 7:
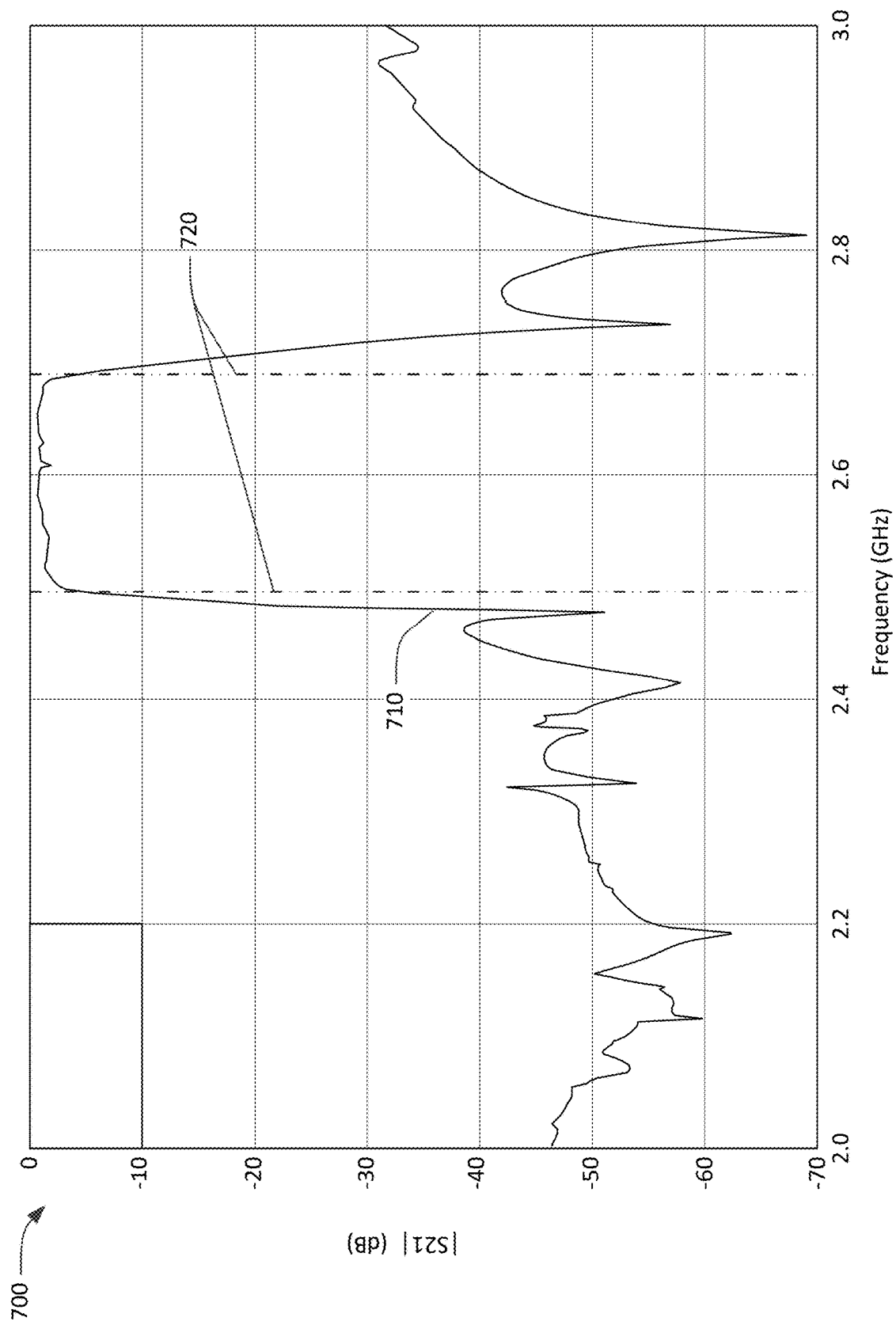
FIG. 7 is a graph of input-output transfer functions of an embodiment of the matrix filter of FIGS. 4-6.

FIG. 7 is graph 700 of an estimated performance of a matrix filter similar to the matrix filter 500. The curve 710 is a plot of S21, the input-output transfer function, of the filter determined by estimation of a physical model of the filter. The broken lines 720 mark the band edges of 5G NR communication band n41. The matrix filter architecture extends the application of XBARs to lower frequency communications bands that are impractical using a conventional ladder filter architecture.

The concepts described above for FIGS. 5-7 may be applied to form filters such as filter 500 but with different ranges and/or center points of the pass band. For example, a filter similar to filter 500 may be built with broken lines 720 that mark the band edges of 5G NR communication band n40 or n46.

Description of Methods

Figure 8:
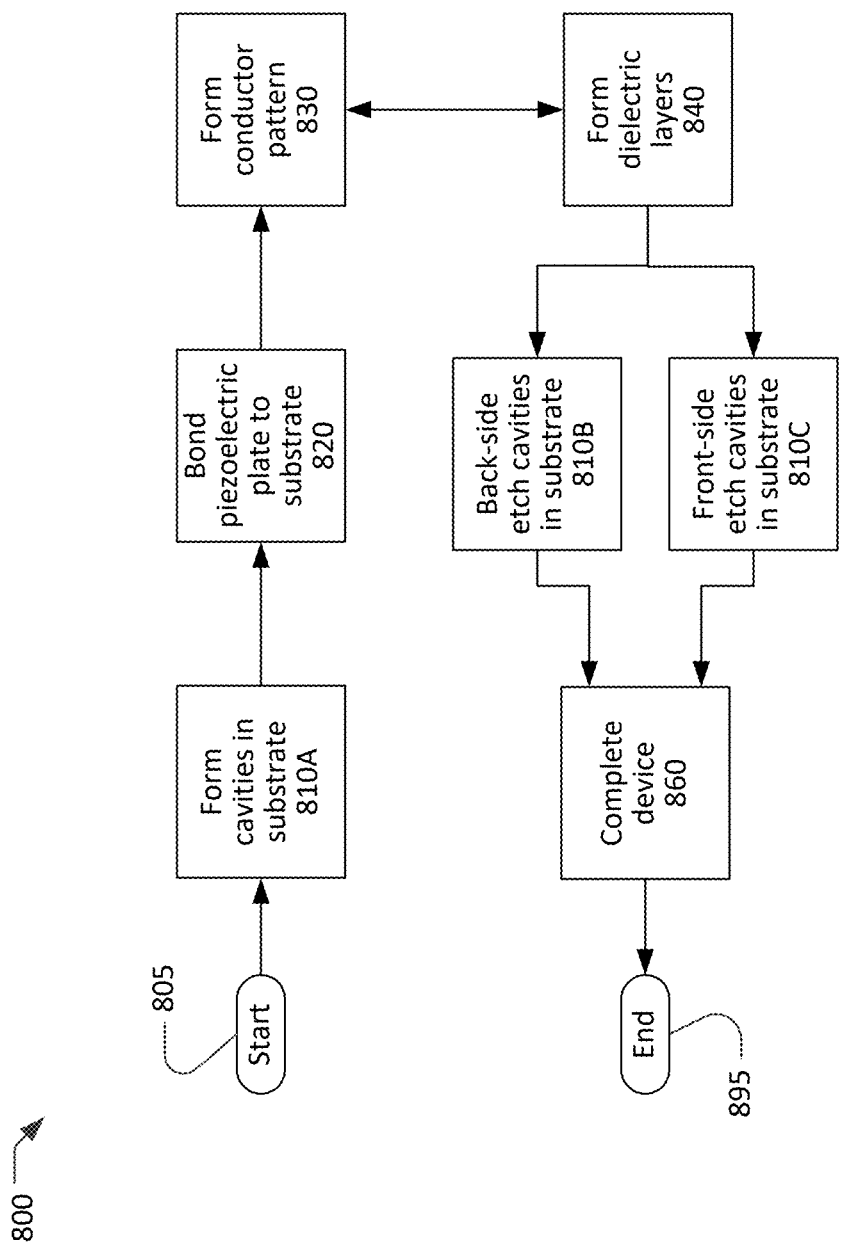
FIG. 8 is flow chart of a process for making a matrix filter using transversely-excited film bulk acoustic resonators.

FIG. 8 is a simplified flow chart showing a process 800 for making an XBAR or a filter incorporating XBARs. The process 800 starts at 805 with a substrate and a plate of piezoelectric material and ends at 895 with a completed XBAR or filter. It may be an example for forming any of the XBARs herein with any of the piezoelectric plate portions 610-1, 2 or 3 of one or more piezoelectric plates one any one or more of substrates 620-1, 2 or 3. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

The flow chart of FIG. 8 captures three variations of the process 800 for making an XBAR which differ in when and how cavities are formed in the substrate. The cavities may be formed at steps 810A, 810B, or 810C. Only one of these steps is performed in each of the three variations of the process 800.

The piezoelectric plate may be, for example, Z-cut lithium niobate or lithium tantalate with Euler angles 0, 0, 90°. The piezoelectric plate may be rotated Z-cut lithium niobate with Euler angles 0, β, 90°, where β is in the range from −15° to +5°. The piezoelectric plate may be rotated Y-cut lithium niobate or lithium tantalate with Euler angles 0, β, 0, where β is in the range from 0 to 60°. The piezoelectric plate may be some other material or crystallographic orientation. The substrate may preferably be silicon. The substrate may be some other material that allows formation of deep cavities by etching or other processing.

In one variation of the process 800, one or more cavities are formed in the substrate at 810A, before the piezoelectric plate is bonded to the substrate at 820. A separate cavity may be formed for each resonator in a filter device. The one or more cavities may be formed using conventional photolithographic and etching techniques. Typically, the cavities formed at 810A will not penetrate through the substrate.

At 820, the piezoelectric plate is bonded to the substrate. Bonding at 820 may be bonding any of the piezoelectric plates 610-1, 2 or 3 to substrate 620-1, 2 or 3. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 830 by depositing and patterning two or more conductor levels on the front side of the piezoelectric plate. The conductor levels typically include a first conductor level that includes the IDT fingers, and a second conductor level formed over the IDT busbars and other conductors except the IDT fingers. In some devices, a third conductor levels may be formed on the contact pads. Each conductor level may be one or more layers of, for example, aluminum, an aluminum alloy, copper, a copper alloy, or some other conductive metal. Optionally, one or more layers of other materials may be disposed below (i.e. between each conductor layer and the piezoelectric plate) and/or on top of each conductor layer. For example, a thin film of titanium, chrome, or other metal may be used to improve the adhesion between the first conductor level and the piezoelectric plate. The second conductor level may be conduction enhancement layer of gold, aluminum, copper or other higher conductivity metal may be formed over portions of the first conductor level (for example the IDT bus bars and interconnections between the IDTs).

Each conductor level may be formed at 830 by depositing the appropriate conductor layers in sequence over the surface of the piezoelectric plate. The excess metal may then be removed by etching through patterned photoresist. The conductor level can be etched, for example, by plasma etching, reactive ion etching, wet chemical etching, and other etching techniques.

Alternatively, each conductor level may be formed at 830 using a lift-off process. Photoresist may be deposited over the piezoelectric plate. and patterned to define the conductor level. The appropriate conductor layers may be deposited in sequence over the surface of the piezoelectric plate. The photoresist may then be removed, which removes the excess material, leaving the conductor level.

When a conductor level has multiple layers, the layers may be deposited and patterned separately. In particular, different patterning processes (i.e. etching or lift-off) may be used on different layers and/or levels and different masks are required where two or more layers of the same conductor level have different widths or shapes.

At 840, dielectric layers may be formed by depositing one or more layers of dielectric material on the front side of the piezoelectric plate. As previously described, the dielectric layers may include a different dielectric thickness over the IDT fingers of the XBARs within each sub-filter. Each dielectric layer may be deposited using a conventional deposition technique such as sputtering, evaporation, or chemical vapor deposition. Each dielectric layer may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

The matrix filter shown in FIG. 5 and FIG. 6 includes metal-insulator-metal (MIM) capacitors. A MIM capacitor consists of a first metal level and a second metal level separated by a dielectric layer. When a matrix filter includes MIM capacitor, the steps of forming the conductor patterns at 830 and forming the dielectric layers at 840 must overlap. At least one dielectric layer has to be formed at 840 after a first metal level is formed at 830 and before a final metal level is formed at 830. The MIM capacitors may be formed beside or on any of the piezoelectric plate portions 610-1, 2 or 3; or substrates 620-1, 2 or 3.

In a second variation of the process 800, one or more cavities are formed in the back side of the substrate at 810B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 800, a back-side dielectric layer may be formed at 850. In the case where the cavities are formed at 810B as holes through the substrate, the back-side dielectric layer may be deposited through the cavities using a conventional deposition technique such as sputtering, evaporation, or chemical vapor deposition.

In a third variation of the process 800, one or more cavities in the form of recesses in the substrate may be formed at 810C by etching the substrate using an etchant introduced through openings in the piezoelectric plate. A separate cavity may be formed for each resonator in a filter device.

In all variations of the process 800, the filter device is completed at 860. Actions that may occur at 860 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 860 is to tune the resonant frequencies of the resonators within the device by adding or removing metal or dielectric material from the front side of the device. After the filter device is completed, the process ends at 895.

The descriptions herein such as for FIGS. 4-8 provide improved XBAR radio frequency filter configurations by using XBAR sub-filters with different thicknesses of the piezoelectric plate portions connected in parallel between two ports. The sub-filters have a piezoelectric plate with a back surface attached to the different substrates and portions of the plate forming diaphragms spanning cavities in the substrates. Interleaved fingers of IDTs are on the diaphragms. The different thickness portions of the piezoelectric plates may be on different substrates of different die connected in parallel between two ports.

These configurations form a distributed (matrix) XBAR filter that allows for the reduction of required resonator static capacitance C0, and therefore a reduction in required die area. These configurations are also scalable to arbitrary order and can readily be made reconfigurable with the use of RF switches. By incorporating the configurations' multi-die approach, similar to a 'split ladder' topology, additional freedom in the design of the distributed filter is achieved.

Without these configurations, constraining all resonators of multiple sub-filters to a single die requires frequency separation of resonators to be achieved by varying top layer oxide and/or electrode dimensions. Instead, the multi-die configurations introduce the membrane thickness as an additional degree of freedom that may be applied by sub-filter resonator groups.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A radio frequency filter, comprising:
   at least a first sub-filter and a second sub-filter connected in parallel between a first port and a second port, each of the first and second sub-filters comprising:
     at least one piezoelectric layer attached either directly or via one or more intermediate layers to a substrate, the at least one piezoelectric layer having portions that form a plurality of diaphragms over respective cavities of the respective sub-filter; and
     a conductor pattern at only one surface of the at least one piezoelectric layer, the conductor pattern including a plurality of interdigital transducers (IDTs) of a respective plurality of resonators, interleaved fingers of each IDT disposed on a respective diaphragm of the plurality of diaphragms,
   wherein a thickness of the respective portion of the at least one piezoelectric layer of the first sub-filter is different from a thickness of the respective portion of the at least one piezoelectric layer of the second sub-filter, and
   wherein the at least one piezoelectric layer and the respective IDTs of the first and second sub-filters are configured such that radio frequency signals applied to the respective IDTs excite primary shear acoustic modes in the respective portions of the at least one piezoelectric layer that form the respective diaphragms.

2. The filter of claim 1, wherein the at least one piezoelectric layer of the first sub-filter is a same layer as the at least one piezoelectric layer of the second sub-filter.

3. The filter of claim 1, wherein the at least one piezoelectric layer of the first sub-filter is a different layer than the at least one piezoelectric layer of the second sub-filter.

4. The filter of claim 3, wherein the first port is an input of the filter, and the second port is an output of the filter.

5. The filter of claim 1, wherein
   the respective thicknesses of the portions of the at least one piezoelectric layer of the first and second sub-filters are selected to tune the primary shear acoustic modes in the respective portions of the at least one piezoelectric layer.

6. The filter of claim 1, further comprising:
   a third sub-filter connected in parallel between the first port and the second port, the third sub-filter comprising:
     a piezoelectric layer attached either directly or via one or more intermediate layers to the substrate, the piezoelectric layer having portions that form a plurality of diaphragms spanning respective cavities of the third sub-filter; and
     a conductor pattern at a surface of the piezoelectric layer, the conductor pattern including a plurality of interdigital transducers (IDTs) of a respective plurality of resonators, interleaved fingers of each IDT disposed on a respective diaphragm of the plurality of diaphragms,
   wherein a thickness of the piezoelectric layer of the third sub-filter is different from a thickness of the at least one piezoelectric layer of the first and second sub-filters.

7. The filter of claim 6, wherein the thickness of the portion of the at least one piezoelectric layer of the first sub-filter is between 720 nm and 740 nm extending between a front surface and a back surface of the portion of the at least one piezoelectric layer of the first sub-filter; wherein the thickness of the portion of the at least one piezoelectric layer of the second sub-filter is between 752 nm and 772 nm extending between a front surface and a back surface of the portion of the at least one piezoelectric layer of the second sub-filter; and wherein the thickness of the piezoelectric layer of the third sub-filter is between 734 nm and 754 nm extending between a front surface and a back surface of the piezoelectric layer of the third sub-filter.

8. The filter of claim 6, wherein each sub-filter further comprises:
   three resonators connected in series between the first port and the second port; and
   two coupling capacitors, each of which is connected between ground and a respective node between two of the resonators of the sub-filter.

9. The filter of claim 8, further comprising:
   a first low-edge resonator, from the three resonators, connected between the first port and ground;
   a second low-edge resonator, from the three resonators, connected between the second port and ground;
   wherein respective resonance frequencies of the first and second low-edge resonators are adjacent to a lower edge of a passband of the filter.

10. The filter of claim 9, wherein:
    two of the three resonators of each sub-filter are symmetrical in response;
    the low-edge resonators have the same response;
    each of the coupling capacitors is a metal-insulator-metal capacitor; and
    the sub-filters and the low-edge resonators form a matrix filter having a contiguous passband formed by passbands of the sub-filters; and a center frequency of a passband of each sub-filter is different from a center frequency of any other sub-filter.

11. The filter of claim 6, wherein:
    the thickness of the portion of the at least one piezoelectric layer of the first sub-filter is thinner than the thickness of the portion of the at least one piezoelectric layer of the second sub-filter; and
    the thickness of the portion of the at least one piezoelectric layer of the second sub-filter is thinner than the thickness of the piezoelectric layer of the third sub-filter.

12. A radio frequency filter, comprising:
    a first sub-filter and a second sub-filter connected in parallel between a first port and a second port, the first sub-filters comprising:
      a first piezoelectric layer attached either directly or via one or more intermediate layers to a first substrate of a first die, the first piezoelectric layer having first portions that form a first plurality of diaphragms over first respective cavities of the respective first sub-filter; and
      a first conductor pattern at a surface of the first piezoelectric layer, the first conductor pattern including a first plurality of interdigital transducers (IDTs) of a first respective plurality of resonators, first interleaved fingers of each first IDT disposed on a first respective diaphragm of the first plurality of diaphragms;

the second sub-filters comprising:
  a second piezoelectric layer attached either directly or via one or more intermediate layers to a second substrate of a second die, the second piezoelectric layer having second portions that form a second plurality of diaphragms over second respective cavities of the respective second sub-filter; and
  a second conductor pattern at a surface of the second piezoelectric layer, the second conductor pattern including a second plurality of interdigital transducers (IDTs) of a second respective plurality of resonators, second interleaved fingers of each second IDT disposed on a second respective diaphragm of the second plurality of diaphragms; and
wherein a thickness of the portions of the first piezoelectric layer are thicker than a thickness of the portions of the second piezoelectric layer,
wherein the first port is an input of the filter, and the second port is an output of the filter, and
wherein the first and second piezoelectric layers and the first and second plurality of IDTs are configured such that radio frequency signals applied to the first and second plurality of IDTs excite primary shear acoustic modes in the first and second portions of the respective piezoelectric layers.

13. The filter of claim 12, wherein the first piezoelectric layer is a same layer as the second piezoelectric layer.

14. The filter of claim 12, wherein the first piezoelectric layer is a different layer than the second piezoelectric layer.

15. The filter of claim 12, wherein
the thicknesses of the first and second portions of the respective piezoelectric layers are selected to tune the primary shear acoustic modes in the first and second portions.

16. The filter of claim 12,
wherein each sub-filter further comprises:
  three resonators connected in series between the first port and the second port;
  two coupling capacitors, each of which is connected between ground and a respective node between two of the resonators of the sub-filter; and
wherein the filter further comprises:
  a first low-edge resonator, from the three resonators, connected between the first port and ground;
  a second low-edge resonator, from the three resonators, connected between the second port and ground;
  wherein respective resonance frequencies of the first and second low-edge resonators are adjacent to a lower edge of a passband of the filter.

17. A radio frequency filter, comprising:
a first sub-filter, a second sub-filter and a third sub-filter that are each connected in parallel between a first port and a second port, each of the first, second and third sub-filters comprising:
  at least one piezoelectric layer attached either directly or via one or more intermediate layers to a substrate, the at least one piezoelectric layer having portions that form plurality of diaphragms over respective and separate cavities of the respective sub-filter; and
  a conductor pattern at a surface of the at least one piezoelectric layer, the conductor pattern including a plurality of interdigital transducers (IDTs) of a respective plurality of resonators, interleaved fingers of each IDT disposed on a respective diaphragm of the plurality of diaphragms,
wherein a thickness of the portion of the at least one piezoelectric layer of the first sub-filter is different from a thickness of the portion of the at least one piezoelectric layer of the second and third sub-filter,
wherein a thickness of the portion of the at least one piezoelectric layer of the second sub-filter is different from a thickness of the portion of the at least one piezoelectric layer of the third sub-filter, and
wherein the respective portions of the at least one piezoelectric layer and the plurality of IDTs of the first, second and third sub-filter are configured such that radio frequency signals applied to the plurality of IDTs excite primary shear acoustic modes in the respective portions of the at least one piezoelectric layer.

18. The filter of claim 17, wherein the at least one piezoelectric layer of the first sub-filter is a different layer than each of the at least one piezoelectric layer of the second sub-filter and the third sub-filter, and wherein
the at least one piezoelectric layer of the second sub-filter is a different layer than the at least one piezoelectric layer of the third sub-filter.

19. The filter of claim 18, wherein the substrate of the second sub-filter is different than the substrate of the third sub-filter.

20. The filter of claim 17, wherein
the thicknesses of the respective portions of the at least one piezoelectric layer of the first, second and third sub-filters are selected to tune the primary shear acoustic modes in the respective portions of the at least one piezoelectric layer.

* * * * *